United States Patent
Akiyama et al.

(10) Patent No.: US 6,670,261 B2
(45) Date of Patent: Dec. 30, 2003

(54) PRODUCTION METHOD FOR ANNEALED WAFER

(75) Inventors: Shoji Akiyama, Annaka (JP); Norihiro Kobayashi, Annaka (JP); Masaro Tamatsuka, Annaka (JP); Takatoshi Nagoya, Annaka (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 0 days.

(21) Appl. No.: 09/979,717
(22) PCT Filed: Mar. 26, 2001
(86) PCT No.: PCT/JP01/02398
§ 371 (c)(1), (2), (4) Date: Nov. 28, 2001
(87) PCT Pub. No.: WO01/73838
PCT Pub. Date: Oct. 4, 2001

(65) Prior Publication Data
US 2002/0160591 A1 Oct. 31, 2002

(30) Foreign Application Priority Data
Mar. 29, 2000 (JP) .......................................... 2000-92155

(51) Int. Cl.$^7$ ............................................. H01L 21/425
(52) U.S. Cl. ....................................... 438/530; 438/906
(58) Field of Search .................................. 438/530, 795, 438/906

(56) References Cited

U.S. PATENT DOCUMENTS

| | | | |
|---|---|---|---|
| 5,804,494 A | 9/1998 | Mitani et al. ............... | 438/455 |
| 6,228,166 B1 | 5/2001 | Suzuki et al. ................. | 117/94 |

FOREIGN PATENT DOCUMENTS

| | | |
|---|---|---|
| EP | 0 844 649 A2 | 5/1998 |

OTHER PUBLICATIONS

Japanese Publication No. 11–135511A, May 21, 1999, Abstract Only.
Japanese Publication No. 4–97517A, Mar. 30, 1992, Abstract Only.
Japanese Publication No. 11–233476A, Aug. 27, 1999, Abstract Only.
Japanese Publication No. 9–18008A, Jan. 17, 1997, Abstract Only.
Japanese Publication No. 11–288942A, Oct. 19, 1999, Abstract Only.
Japanese Publication No. 10–144697A, May 29, 1998, Abstract Only.

*Primary Examiner*—Amir Zarabian
*Assistant Examiner*—Pamela E Perkins
(74) *Attorney, Agent, or Firm*—Arent Fox Kintner Plotkin & Kahn

(57) ABSTRACT

There is provided a manufacturing process for an annealed wafer capable of reducing boron contamination occurring while annealing is performed in a state where a wafer surface after cleaning is exposed to a gas in Ar atmosphere to suppress a change in resistivity due to an increase in a boron concentration in the vicinity of the wafer surface after annealing and manufacture an annealed wafer in which a difference in a boron concentration between a surface layer portion thereof and a bulk portion thereof is essentially not a problem even if a silicon wafer having a comparative low boron concentration ($1 \times 10^{16}$ atoms/cm$^3$ or less) is used as the annealed wafer. The manufacturing process for an annealed wafer comprises: cleaning a silicon wafer; and loading the silicon wafer into a heat treatment furnace to heat-treat the silicon wafer in an Ar atmosphere, wherein an aqueous solution including hydrofluoric acid is used as a final cleaning liquid in the cleaning.

2 Claims, 6 Drawing Sheets

PRODUCTION METHOD FOR ANNEALED WAFER

TECHNICAL FIELD

The present invention relates to a manufacturing process for an annealed wafer capable of suppressing a change in resistivity due to an increase in a boron concentration in the vicinity of a wafer surface after annealing in an Ar atmosphere.

BACKGROUND ART

It has been known that there exist defects named so-called grown-in defects such as COP (Crystal Originated Particle), oxide precipitates and so on in a CZ silicon wafer. A proposal has been made on a heat treatment performed in a hydrogen atmosphere (hereinafter may be referred to as "hydrogen annealing") as a method for annihilating grown-in detects in the vicinity of a wafer surface. This heat treatment is required to use hydrogen at a temperature of 1000° C. or higher, so it is necessary to take a countermeasure from the viewpoint of safety. Therefore, the furnace is required to be modified with a sealed structure for increasing airtightness and an explosion-proof apparatus as a measure against an explosion.

Meanwhile, it has been recently found that even a heat treatment carried out in an argon atmosphere (hereinafter may be referred to as "Ar annealing") can annihilate the grown-in defects in the level equal to hydrogen annealing. Ar annealing is not explosive and then safer compared with hydrogen. Although the Ar annealing has an advantage to need no measure in a safety aspect, it has also been known that the annealing displays a characteristic behavior to a silicon wafer. An example of such a characteristic behavior is a phenomenon that tiny pits are easily formed on a wafer surface subjected to the Ar annealing.

This is caused by the following mechanism. An oxide film is formed by very small amounts of oxygen and water as impurities included in a raw material gas, or oxygen and water in the outside air involved through the furnace opening of the reaction tube in a heat treatment process, and then the oxide film is allowed to react with silicon (Si) according to the following reaction:

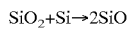

$$SiO_2 + Si \rightarrow 2SiO$$

As a result of the reaction, Si is etched and the etched portion is observed as pits. The pits serve as a cause for degrading a local surface roughness (micro-roughness) and a long-period surface roughness (haze) on a wafer surface. Thus, an Ar gas is sensitive to a trace of impurities and small changes in the environment such as fluctuations in temperature, so the Ar gas has a demerit of difficulty in handling.

However, according to a technique disclosed in JP A 98-144697, the following is taught: When a silicon wafer containing boron as a dopant is subjected to hydrogen annealing or Ar annealing, for the hydrogen annealing, boron in the wafer outdiffuses to reduce a boron concentration in the vicinity of a wafer surface, while for the Ar annealing, there occurs none of such a phenomenon as observed in the hydrogen annealing and a boron concentration does not decrease in a surface layer of a wafer.

That is, the Ar annealing has not only an advantage in a safety aspect, but also another advantage with respect to a wafer characteristic in that after annealing, no change occurs in resistivity in the vicinity of a wafer surface; therefore, an importance of the Ar annealing has grown.

In the mean time, in a process associated with manufacture of an annealed wafer in an atmosphere of an inert gas represented by Ar or in a hydrogen atmosphere, it has been customary that a mirror finished wafer to be annealed is prepared, contaminants attached on a surface of the wafer, such as heavy metals, organic substances and so on are removed by wet cleaning and the wafer is dried, followed by loading the wafer into a heat treatment furnace.

Where a mirror finished silicon wafer is cleaned, cleaning liquids (chemical liquids) of various compositions are used and a general cleaning method is of a proper combination of SC-1 (a liquid mixture of ammonia, hydrogen peroxide and water) cleaning, DHF (dilute hydrofluoric acid aqueous solution) cleaning and SC-2 (a liquid mixture of hydrogen chloride, hydrogen peroxide and water) cleaning.

Then, a cleaning process has been generally performed adopting SC-1 or SC-2 in the final stage in a cleaning process to finish a wafer so as to have a hydrophilic surface on which a natural oxide film is formed by the cleaning solution. This process is similar to wet cleaning of wafers before the wafers are loaded into a heat treatment furnace; after a natural oxide film is formed on a surface of each wafer to finish it hydrophilic, the wafers are loaded into a heat treatment furnace.

However, in the course of repeated experiments performed by the inventors about Ar annealing, it was found that a phenomenon occurred that is entirely contrary to reduction in a boron concentration in the vicinity of a wafer surface that has been observed in hydrogen annealing. That is, when Ar annealing was performed, there was observed a trend that a boron concentration increases in the vicinity of a wafer surface and furthermore, an increment is subtly different according to an annealing batch. Such a phenomenon is desirably to be suppressed to the possible lowest level because it varies resistivity in the vicinity of a wafer surface, which exerts an adverse influence on device characteristics.

The inventors have made an investigation of a contamination source increasing a boron concentration on a surface region of a wafer after Ar annealing and the outcome thereof showed that no contamination source exists in a heat treatment furnace itself but a cause is boron attached onto a wafer surface immediately before annealing. That is, it has been known that a wafer after cleaning is exposed to an environmental atmosphere (air) in a clean room before loading the wafer into a heat treatment furnace and boron builds up in the air from a filter provided for cleaning the air and the boron in the air attaches onto a wafer surface (for example, see JP A 93-253447). It has been estimated that such boron attached on a wafer surface diffuses in the vicinity of a wafer surface during Ar annealing, which increases a boron concentration therein.

Such a phenomenon of boron contamination in a clean room was reported in the past. As one example, it is described in JP A 95-58303 that boron contamination caused by air in a clean room is detected at the bonding interface of a bonding substrate. Furthermore, a problem is pointed out in JP Application No. 99-277255, applied for a patent by the applicant separately, that when a polysilicon film is deposited on a wafer surface, boron contamination is detected at the interface.

However, the above two boron contamination cases were problems which were created at an interface. That is, in these cases, the problems were caused by the fact that boron once attached onto a wafer surface is sandwiched between the wafer and another wafer or polysilicon and cut-off from escape with the result that the boron diffuses into the wafer bulk during a heat treatment. In contrast to this, in case of Ar annealing which the inventors investigated, although a wafer surface during a heat treatment is in a perfectly free state, boron contamination occurs and besides, as described above, in case of hydrogen annealing where a wafer surface during a heat treatment is likewise a free state, a problem arose that boron in a wafer outdiffuses and thereby a boron concentration decreases to the contrary. Therefore, it was absolutely unexpectable phenomenon that a boron concentration on a wafer surface increases in Ar annealing.

The above-mentioned JP A 98-144697 describes that a boron concentration in the vicinity of a wafer surface does not increase even after Ar annealing is performed and a concentration profile is flat in the depth direction. But since a boron concentration of a wafer used therein is high of $1 \times 10^{18}/cm^3$ or higher, it is considered that the boron concentration profile is hardly affected even when boron attached on a wafer surface diffuses into the interior of the wafer unless a great amount of boron contamination occurs.

It is an object of the present invention to provide a manufacturing process for an annealed wafer capable of reducing boron contamination occurring while annealing is performed in a state where a wafer surface after cleaning is exposed to a gas in Ar atmosphere to suppress a change in resistivity due to an increase in a boron concentration in the vicinity of the wafer surface after annealing and manufacture an annealed wafer in which a difference in a boron concentration between a surface layer portion thereof and a bulk portion thereof is essentially not a problem even if a silicon wafer having a comparative low boron concentration ($1 \times 10^{16}$ atoms/$cm^3$ or less) is used as the annealed wafer.

DISCLOSURE OF THE INVENTION

In order to achieve the above object, the present invention is directed to a manufacturing process for an annealed wafer which comprises: cleaning a silicon wafer; and loading the silicon wafer into a heat treatment furnace to heat-treat the silicon wafer in an Ar atmosphere, wherein an aqueous solution including hydrofluoric acid is used as a final cleaning liquid in the cleaning. That is, it was empirically confirmed that boron floating in air in a clean room is harder to attach onto a wafer where a natural oxide film on a surface thereof is removed using the aqueous solution containing hydrofluoric acid as a final cleaning liquid when compared with a wafer surface with a natural oxide film; therefore, it was found that boron contamination can be reduced if a wafer is cleaned using an aqueous solution containing hydrofluoric acid in the final stage of cleaning prior to a heat treatment.

An Ar atmosphere means that a main atmospheric gas is an Ar gas, and a concept including a 100% Ar gas as well as an Ar gas containing other gases of the order of several % (for example, a hydrogen gas of the lower explosion limit, namely, 4% or less).

In this case, if a boron concentration in a silicon wafer to be heat-treated is relatively low of $1 \times 10^{16}$ atoms/$cm^3$ or less, especially $5 \times 10^{15}$ atoms/$cm^3$ or less, the degree of a change in resistivity in a surface layer due to boron contamination is large; therefore, it is preferable that a time of the silicon wafer being in contact with air in a clean room after cleaning it till loading it into a heat treatment furnace is 5 hours or less.

It is preferable that a heat treatment temperature for annealing is 1050° C. or higher in order to sufficiently annihilate crystal defects in the vicinity of a surface of the silicon wafer by the annealing. With a temperature exceeding 1300° C., not only is a load applied to the heat treatment furnace, but also there arise problems, that is, reduction in strength of the silicon wafer itself, heavy metal contamination thereof and others; therefore, it is preferable that a heat treatment temperature is 1300° C. or lower. A concentration of hydrofluoric acid of the above-mentioned aqueous solution containing hydrofluoric acid is preferably in the range of from 0.5 to 5 wt %, and more preferably from 1 to 3 wt %. If the concentration is less than 0.5 wt %, a removal rate of a natural oxide film is non-practically slow and on the other hand, if the concentration exceeds 5 wt %, attachment of particles unpreferably increases.

BEST MODE FOR CARRYING OUT THE INVENTION

Figure 1:
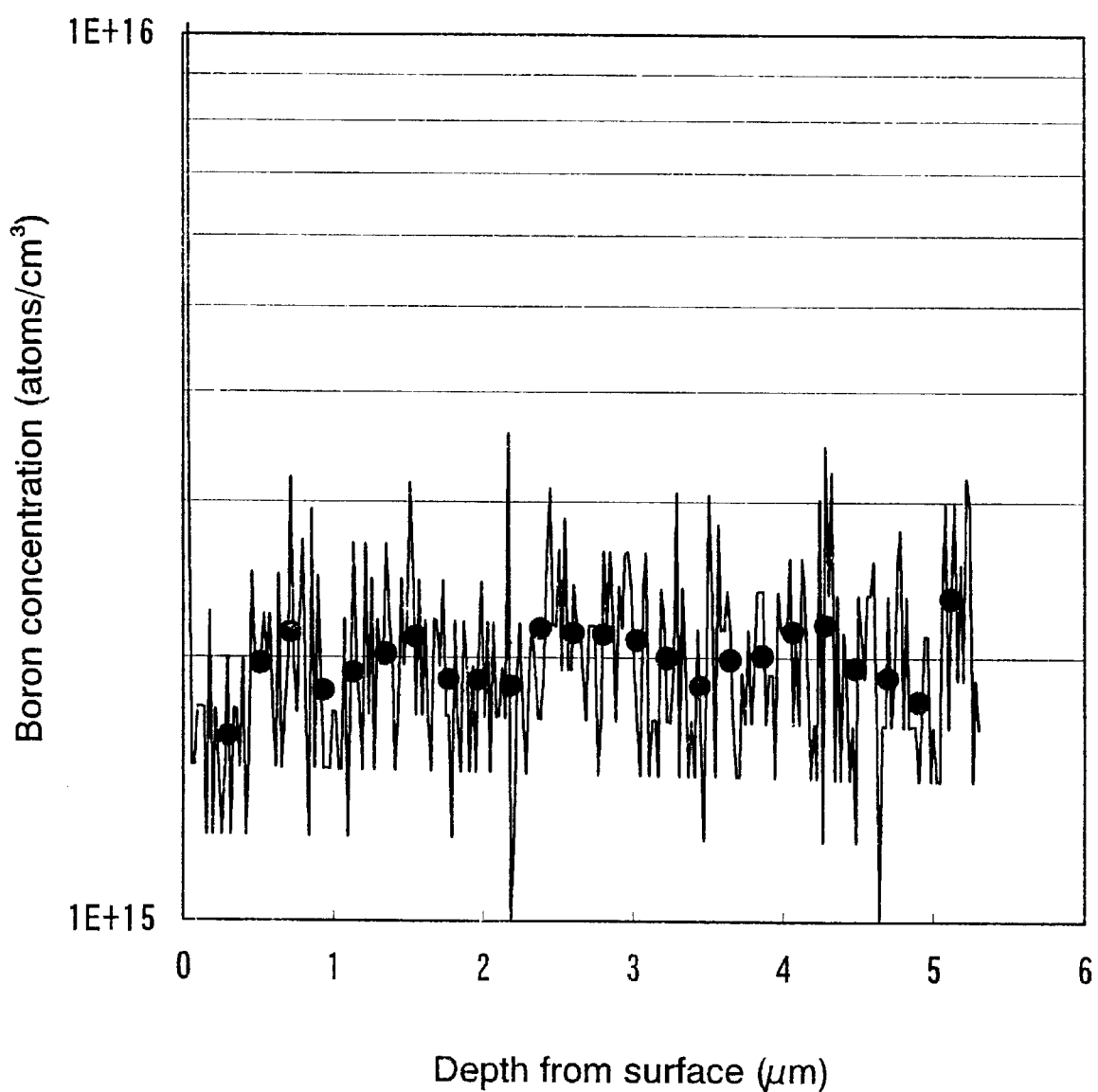
FIG. 1 is a graph showing a boron profile in a specimen wafer subjected to Ar annealing in Example 1.
Figure 2:
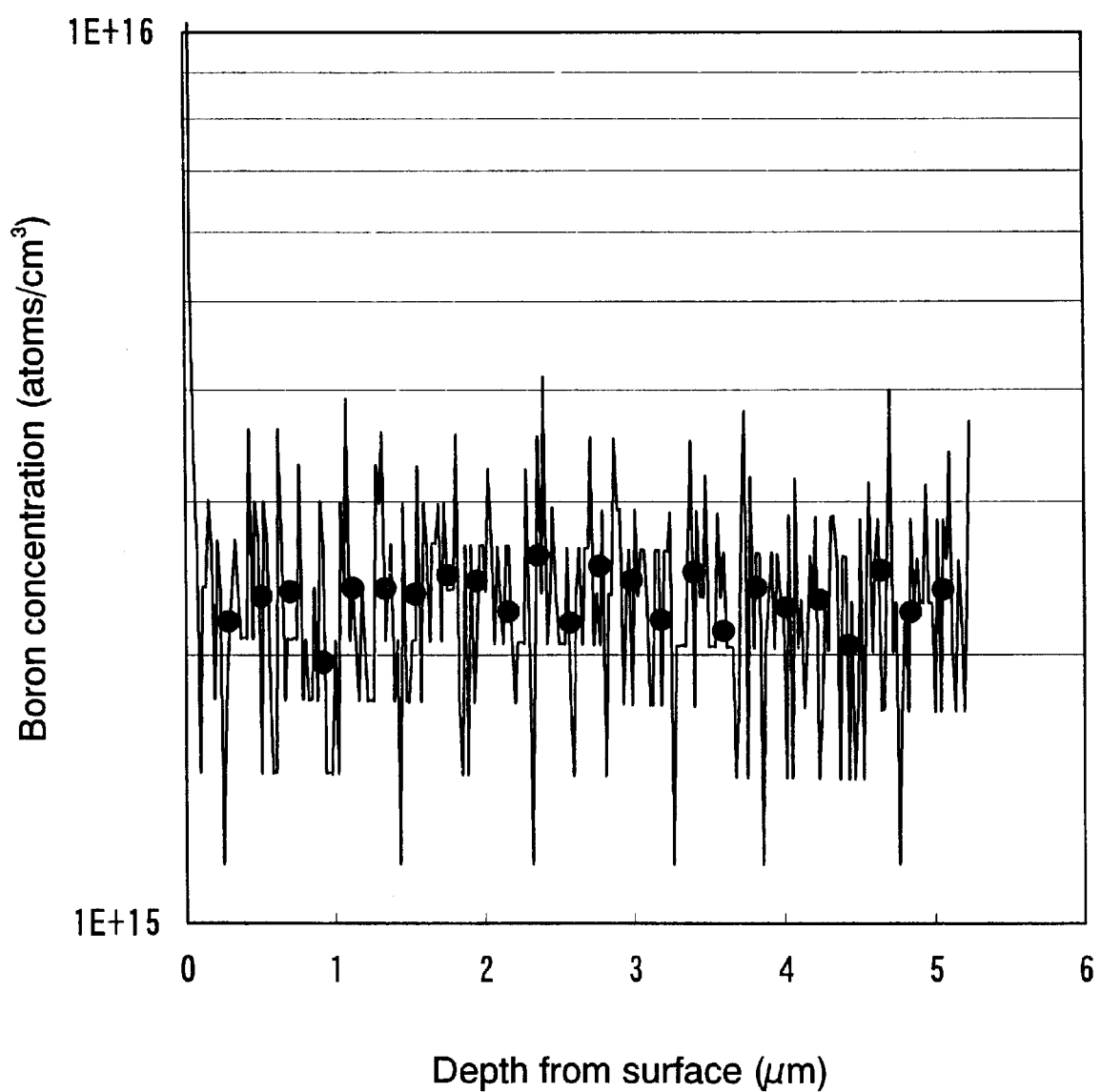
FIG. 2 is a graph showing a boron profile in a specimen wafer subjected to Ar annealing in Example 2.
Figure 3:
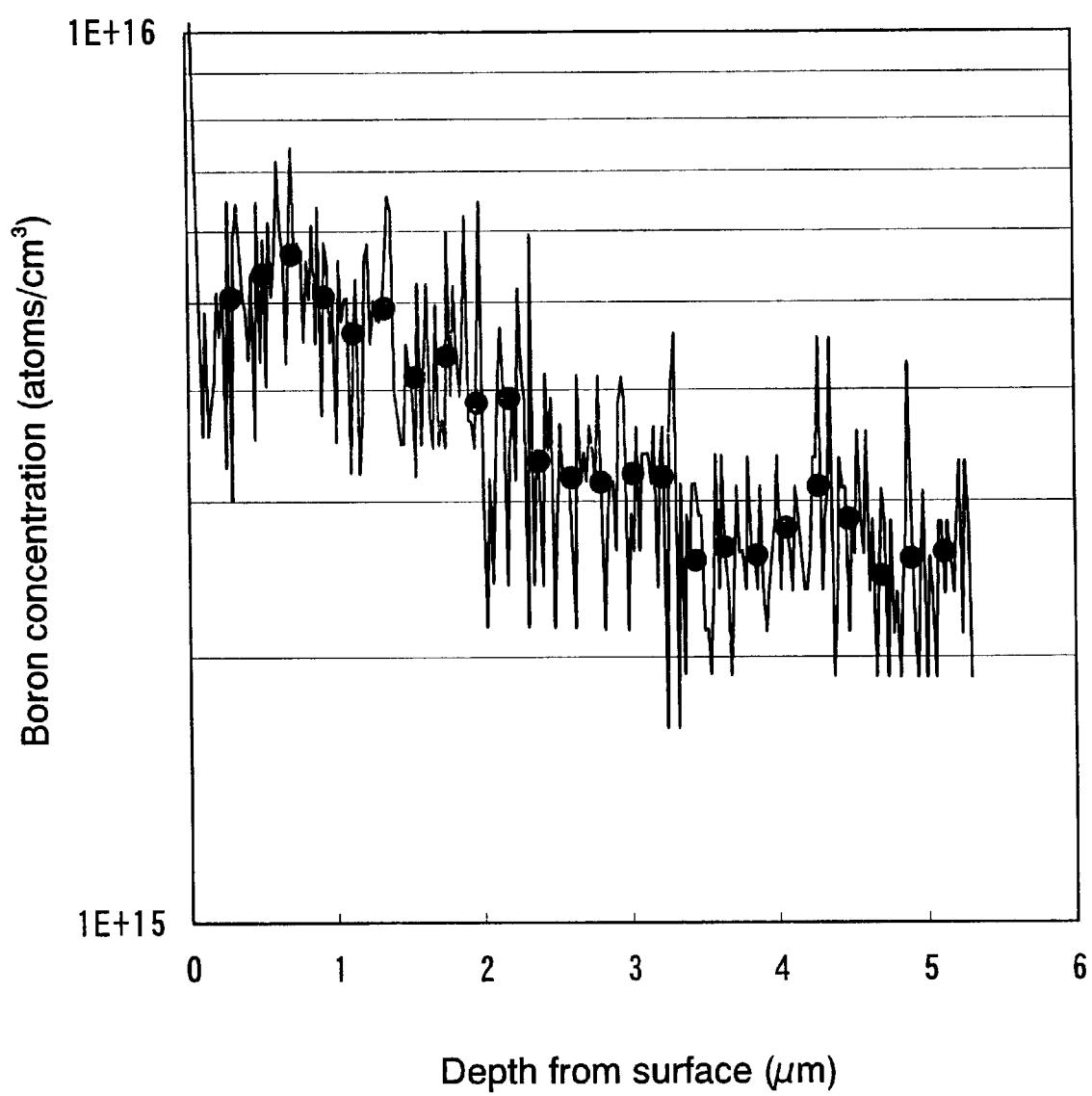
FIG. 3 is a graph showing a boron profile in a specimen wafer subjected to Ar annealing in Comparative Example 1.
Figure 4:
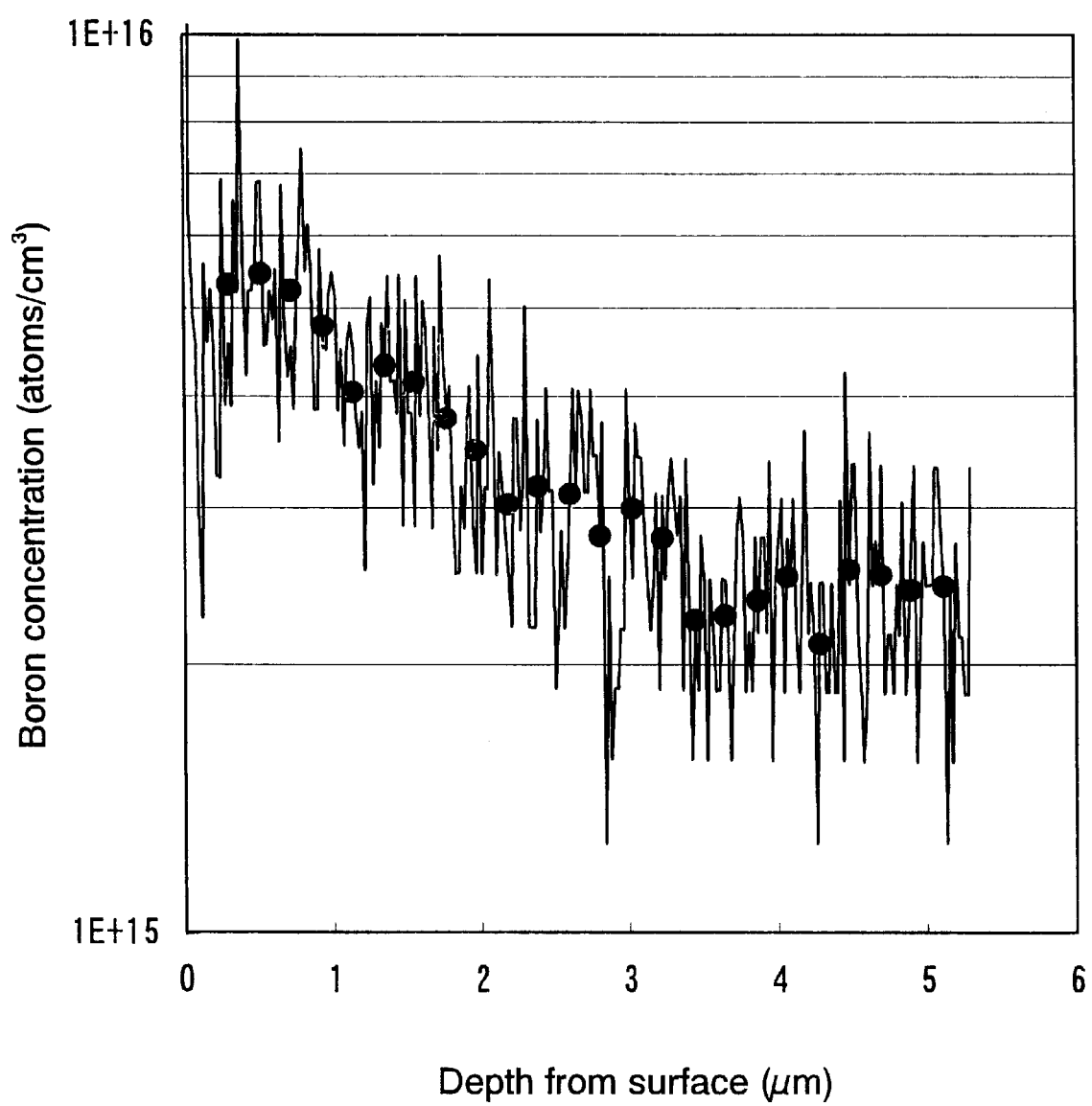
FIG. 4 is a graph showing a boron profile in a specimen wafer subjected to Ar annealing in Comparative Example 2.

Description will be given of the present invention below taking up Examples and it is needless to say that the Examples are presented by way of illustration but should not be construed by way of limitation. (Examples 1 and 2, and Comparative Examples 1 and 2)

In the experiments, cleaning methods were examined, wherein cleaning levels were set in the following 4 ways:

Cleaning level 1: SC1+SC2+SC1+DHF (Example 1)
Cleaning level 2: SC1+SC1+DHF (Example 2)
Cleaning level 3: SC1+SC2+SC1 (Comparative Example 1) and
Cleaning level 4: No cleaning (Comparative Example 2).

The above-described cleaning conditions are as follows.

SC1: a cleaning at 80° C. for 3 minutes using a mixture solution prepared such that a 29 wt % $NH_4OH$ aqueous solution, a 30 wt % $H_2O_2$ aqueous solution and pure water are mixed in a volume ratio of 1:1:10.

SC2: a cleaning at 80° C. for 3 minutes using a mixture solution prepared such that a 30 wt % HCl aqueous solution, a 30 wt % $H_2O_2$ aqueous solution and pure water are mixed in a volume ratio of 1:1:200.

DHF: a cleaning at room temperature for 3 minutes using a 1.5 wt % HF aqueous solution prepared such that a 49 wt % HF aqueous solution is diluted with pure water.

Note that drying after the cleaning is performed in a uniform manner by means of a drying method using IPA (isopropyl alcohol).

Specimen wafers in use each have a diameter of 150 mm, a conductivity type of p-type, a crystal axis orientation of <100>, a boron concentration of 1.5 to $2.5 \times 10^{15}$ atoms/$cm^3$, an interstitial oxygen concentration of 18 ppma [JEIDA (Japan Electronic Industry Development Association) standard].

Immediately after the specimen wafers were subjected to the above cleaning, they were put into a wafer storage case made of polypropylene not to be in contact with an atmospheric gas in a clean room. After an elapse of 30 minutes, the cleaned specimen wafers were set on a wafer boat to start a heat treatment. Heat treatment conditions at this time were at 1150° C. for 4 hours in a 100% Ar atmosphere. Boron contamination after the heat treatment was measured by means of Secondary Ion Mass Spectrometer (SIMS). Results of the measurement are shown in FIGS. 1 to 4. Black circles in FIGS. 1 to 4 are each to show the average of measured values (at 10 points) in the range of 0.2 $\mu$m width as a center of the depth of each black point.

According to the results, at the cleaning levels 3 and 4 (Comparative Examples 1 and 2), it is observed that boron concentrations in the surface layers increase. On the other hand, at the cleaning levels 1 and 2 (Examples 1 and 2) including a HF treatment, it is not observed that the above-mentioned increase in boron concentrations in the surface layers. It is found that the HF treatment is very effective against boron contamination. Ratios in boron concentrations of the surface layer portions of the wafers cleaned at the cleaning levels 1 and 2 (Examples 1 and 2) (the average over a depth of 0.5 $\mu$m from the surface, wherein data obtained up to a depth of 0.05 $\mu$m from the surface is not included for the calculation because correct data are not obtained therefrom due to large noise.) to the bulk portions thereof (the average in the vicinity of about 5 $\mu$m in depth) fall within almost 1±0.1; annealed wafers each having a uniform boron concentration from the surface to the interior can be manufactured.

Experimental Example 1

In this experiment, cleaning processes were performed in a uniform manner at the cleaning level 1 (SC1+SC2+SC1 and DHF). Specimen wafers in use were the same as those of Example 1.

Figure 5:
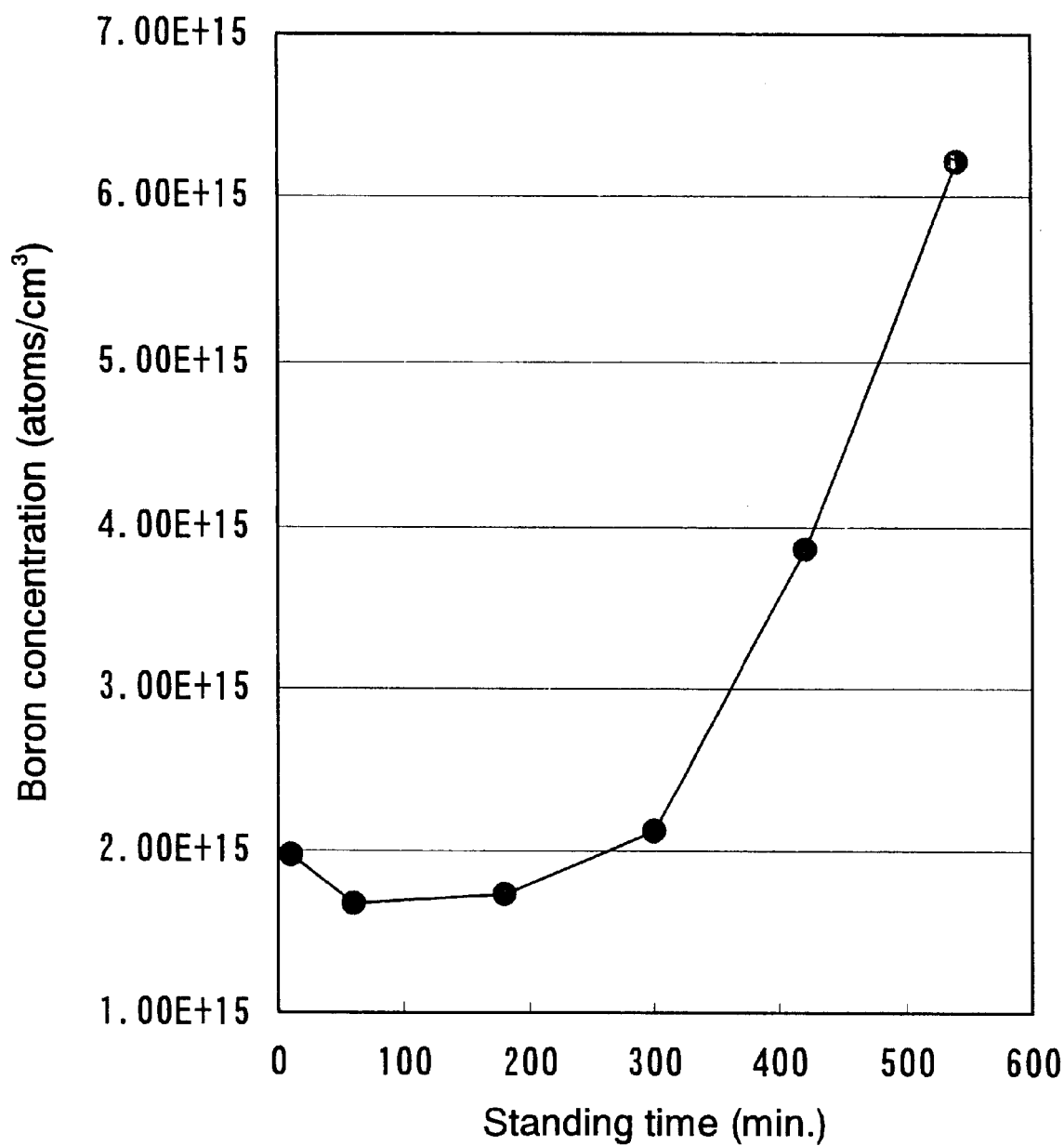
FIG. 5 is a graph showing a relationship between a standing time (after cleaning) and a boron concentration of a specimen wafer of Experimental Example 1.

Herein, with standing times in air of a clean room after cleaning the specimen wafers till packaging them into a wafer storage case being set at 6 levels including 10 minutes, 1 hour, 3 hours, 5 hours, 7 hours and 9 hours, the experiment was carried out. The specimen wafers were subjected to the same heat treatment as that in Example 1, followed by boron analysis with SIMS, which results are shown in FIG. 5, wherein measured values each are the average over 0.05 $\mu$m to 0.5 $\mu$m in depth from the surface. As is apparent from FIG. 5, boron contamination was observed on specimen wafers whose standing time exceeds 5 hours. Accordingly, it is considered to be preferable that a standing time after the cleaning is 5 hours or less.

Experimental Example 2

Likewise, in this experiment, cleaning processes were performed in a uniform manner at the cleaning level 1 (SC1+SC2+SC1 and DHF). Specimen wafers in use were the same as those of Example 1.

Figure 6:
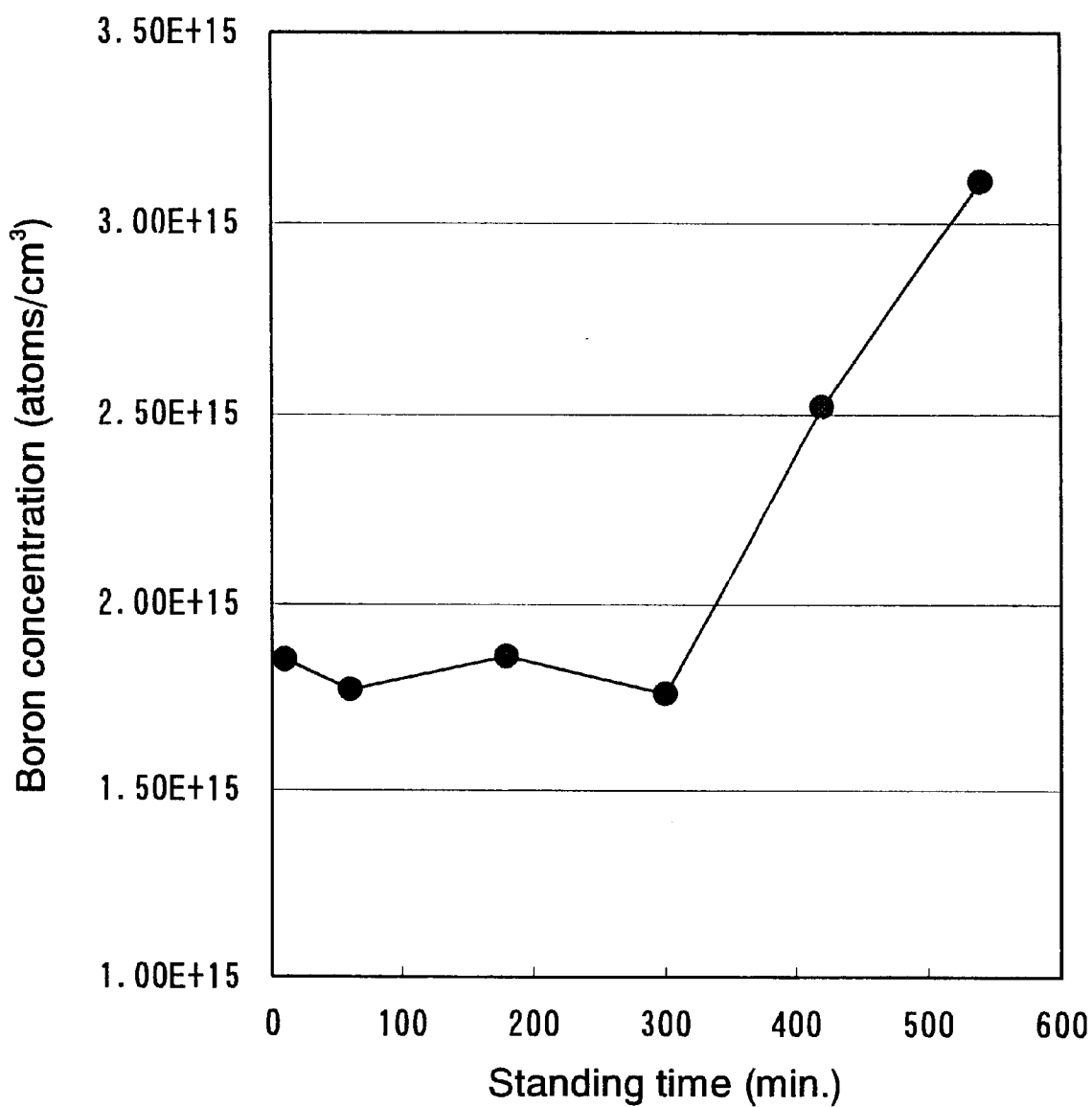
FIG. 6 is a graph showing a relationship between a standing time (on a wafer boat) and a boron concentration of a specimen wafer of Experimental Example 2.

Herein, the specimen wafers were packaged into a wafer storage case directly after the cleaning. After an elapse of 30 minutes, the specimen wafers were set on a wafer boat and put into contact with air in a clean room, and with standing times till the start of a heat treatment being set at 6 levels including 10 minutes, 1 hour, 3 hours, 5 hours, 7 hours and 9 hours, the experiment was carried out. The specimen wafers were subjected to the same heat treatment as that in Example 1, followed by boron analysis with SIMS, which results are shown in FIG. 6, wherein measured values are respective averages over 0.05 $\mu$m to 0.5 $\mu$m in depth from the surface. As is apparent from FIG. 6, boron contamination was observed on specimen wafers whose standing time exceeds 5 hours. Accordingly, it is considered to be preferable that a standing time is 5 hours or less.

Capability of Exploitation in Industry

According to the present invention, as described above, there can be achieved an effect of being capable of reducing boron contamination occurring while annealing is performed in a state where a wafer surface after cleaning is exposed to a gas in Ar atmosphere to suppress a change in resistivity due to an increase in a boron concentration in the vicinity of the wafer surface after annealing and manufacture an annealed wafer in which a difference in a boron concentration between a surface layer portion thereof and a bulk portion thereof is essentially not a problem even if a silicon wafer having a comparative low boron concentration ($1\times10^{16}$ atoms/cm$^3$) is used as the annealed wafer.

What is claimed is:

1. A manufacturing process for an annealed wafer comprising:

cleaning a silicon wafer with a boron concentration of $1\times10^{16}$ atoms/cm$^3$ or less;

contacting the wafer with air in a clean room for no more than five hours following cleaning; and loading the silicon wafer into a heat treatment furnace to heat-treat the silicon wafer in an Ar atmosphere, wherein an aqueous solution including hydrofluoric acid is used as a final cleaning liquid in the cleaning.

2. A manufacturing process for an annealed wafer according to claim 1, wherein the heat treatment temperature is in the range of from 1050° to 1300° C.

* * * * *